United States Patent
Woltman et al.

(10) Patent No.: US 9,140,971 B2
(45) Date of Patent: Sep. 22, 2015

(54) SCANNING LASER PROXIMITY DETECTION

(71) Applicant: Microvision, Inc., Redmond, WA (US)

(72) Inventors: Scott Woltman, Lynnwood, WA (US); Robert James Jackson, Monroe, WA (US)

(73) Assignee: Microvision, Inc., Redmond, WA (US)

( * ) Notice: Subject to any disclaimer, the term of this patent is extended or adjusted under 35 U.S.C. 154(b) by 163 days.

(21) Appl. No.: 14/069,183

(22) Filed: Oct. 31, 2013

(65) Prior Publication Data

US 2015/0116672 A1    Apr. 30, 2015

(51) Int. Cl.
  G03B 21/26    (2006.01)
  G03B 21/20    (2006.01)
  H04N 9/31     (2006.01)

(52) U.S. Cl.
  CPC ........ G03B 21/2086 (2013.01); G03B 21/2053 (2013.01); G03B 21/26 (2013.01); H04N 9/3129 (2013.01); H04N 9/3194 (2013.01)

(58) Field of Classification Search
  CPC .. G03B 21/26; G03B 21/2053; H04N 9/3129; H04N 9/3194
  USPC .......................................................... 353/97
  See application file for complete search history.

(56) References Cited

U.S. PATENT DOCUMENTS

| | | |
|---|---|---|
| 6,930,300 B1 | 8/2005 | Douma et al. |
| 2001/0005262 A1 | 6/2001 | Tsurushima |
| 2009/0066916 A1 | 3/2009 | Brown |
| 2009/0147224 A1* | 6/2009 | Kurozuka et al. ............... 353/98 |
| 2012/0120375 A1* | 5/2012 | Kilcher et al. .................. 353/98 |
| 2013/0003026 A1 | 1/2013 | Rothaar |

FOREIGN PATENT DOCUMENTS

KR    10-0754683    9/2007

OTHER PUBLICATIONS

Microvision, "International Search Report and Written Opinion", PCT/US2014/061932 ISR and Written Opinion.

* cited by examiner

*Primary Examiner* — William C Dowling
*Assistant Examiner* — Ryan Howard
(74) *Attorney, Agent, or Firm* — Kevin D. Wills

(57) ABSTRACT

A scanning laser projector detects obstructions in a projector field of view using a proximity detector that detects infrared light at a photodetector. The photodetector is tested with an additional infrared light source. The additional infrared light source may also be used as proximity detector that can detect a local obstruction blocking the photodetector.

15 Claims, 7 Drawing Sheets

SCANNING LASER PROXIMITY DETECTION

FIELD

The present invention relates generally to scanning laser projection systems, and more specifically to safety and test mechanisms in scanning laser projection systems.

BACKGROUND

Laser Time of Flight (TOF) distance measurement systems typically measure the round-trip time of a laser light pulse that has reflected off a target. Laser TOF systems can be employed in scanning laser projectors to determine if an obstruction exists in a laser light path. When an obstruction exists, laser light sources may be turned off to avoid causing damage to the obstruction.

DESCRIPTION OF EMBODIMENTS

Figure 1:
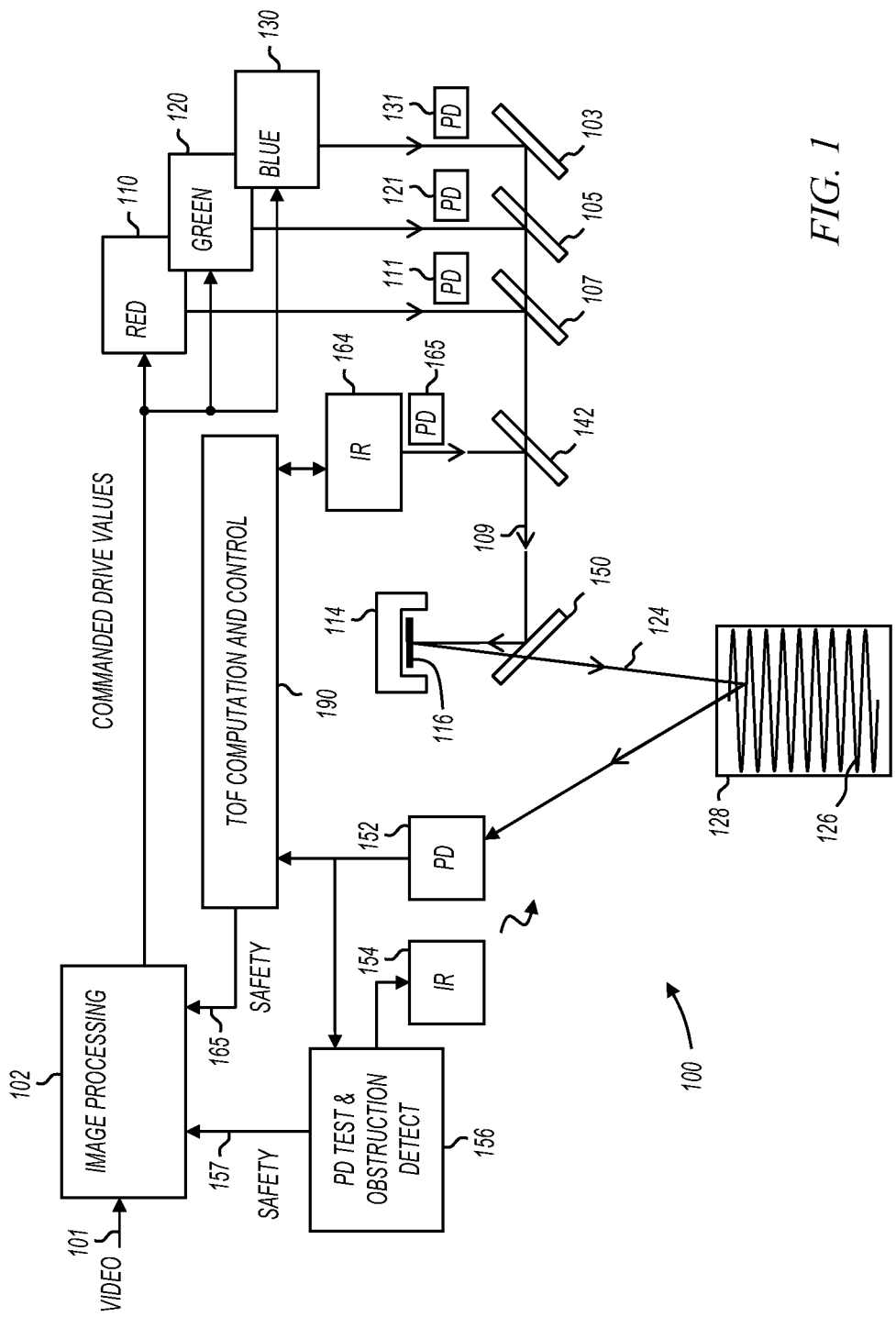
FIG. 1 shows a scanning laser projection system in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

A proximity detector is used to enable a high brightness laser projector with a Class 2 laser classification. In some embodiments of the present invention, a scanning laser projector scans a modulated light beam that includes both visible and invisible light. An infrared (IR) laser light beam is scanned along with red, green, and blue laser light beams to project a visible image with an invisible (IR) overlay. If the IR laser light is incident upon an object, a portion of that light will be reflected back towards the projector. A first photodetector, referred to herein as a "TOF photodetector," can be used to sense this light and enable calculation of the time of flight for the IR light signal to determine the distance between the projector and the sensed object.

Given current laser regulations, single points of failure should be considered within the system. Various embodiments of the present invention include circuits and systems to test both transmit and receive circuits of the proximity detection function. For example, additional photodetectors, referred to herein as "light source photodetectors," may be included near the light sources to determine whether the laser light sources are functioning (transmit circuits). Also for example, a second IR light source may be located near, and partially directed at, the TOF photodetector. This second IR light source may be used to test the functionality of the TOF photodetector (receive circuits).

Periodically, the additional IR light source may be pulsed for a short duration, (e.g., during vertical flyback). When pulsed, the TOF photodetector detects the IR light and creates a photocurrent signal, which can be processed by the system circuitry and logic. The additional IR light source may be pulsed regularly to verify that the TOF photodetector is working in the absence of an object in the projector field of view creating a signal.

In addition to testing the TOF photodetector, the additional IR light source may be used to detect local obstructions that block the TOF photodetector from receiving reflected IR laser light. If, for example, a finger is placed over the TOF photodetector, but does not block the main scanning beam used to project the IR laser light, the proximity detection system will not be able to detect other objects in the projector's field of view and will report only that there are no objects within its detection range. Various embodiments of the present invention use the additional IR light source and the TOF photodetector as a local proximity detector to detect these local obstructions.

FIG. 1 shows a scanning laser projection system in accordance with various embodiments of the present invention. Scanning laser projector 100 includes image processing component 102, TOF computation and control component 190, red laser light source 110, green laser light source 120, blue laser light source 130, and infrared laser light source 164. Modulated light from the laser light sources is combined using mirrors 103, 105, 107, and 142 to form a modulated light beam 109. Scanning laser projector 100 also includes fold mirror 150, and scanning platform 114 with scanning mirror 116. Scanning laser projector 100 also includes laser light source photodetectors (PD) 111, 121, 131, and 165.

In operation, image processing component 102 processes video content at 101 using two dimensional interpolation algorithms to determine the appropriate spatial image content for each scan position. This content is then mapped to a commanded current for each of the red, green, and blue laser light sources such that the output intensity from the lasers is consistent with the input image content. In some embodiments, this process occurs at output pixel speeds in excess of 150 MHz.

Laser light source photodetectors 111, 121, 131, and 165 are used to test, verify, and calibrate the operation of laser light sources 110, 120, 130, and 164. For example, in some embodiments, laser light source photodetectors 111, 121, 131, and 165 are positioned to detect whether the corresponding laser light source is producing light. In some embodiments, the laser light source photodetectors are coupled (not shown) to a control circuit such as image processing component 102. This provides closed loop operation for control of the laser light sources, and allows for test and calibration of the laser light sources. In some embodiments, the laser light source photodetectors are placed to detect monochrome light beams as shown in FIG. 1, and in other embodiments, the laser light source photodetectors are placed to detect light in a color beam such as modulated laser light beam 109. The placement of laser light source photodetectors 111, 121, 131, and 165 is not a limitation of the present invention.

The modulated laser light beam 109 is then directed onto an ultra-high speed gimbal mounted two-dimensional bi-axial laser scanning mirror 116. In some embodiments, this bi-axial scanning mirror is fabricated from silicon using microelectromechanical system (MEMS) processes. In some embodiments, the MEMS device uses electromagnetic actuation, achieved using a miniature assembly containing the MEMS die, small subassemblies of permanent magnets and an electrical interface, although the various embodiments are not limited in this respect. For example, some embodiments employ electrostatic or piezoelectric actuation. Any type of mirror actuation may be employed without departing from the scope of the present invention.

A scanning mirror drive circuit (not shown) provides one or more drive signal(s) to control the angular motion of scanning mirror 116 to cause output beam 124 to generate a raster scan 126 across a projector field of view 128. In some embodiments, raster scan 126 is formed by combining a sinusoidal component on the horizontal axis and a sawtooth component on the vertical axis. In these embodiments, controlled output beam 124 sweeps back and forth left-to-right in a sinusoidal pattern, and sweeps vertically (top-to-bottom) in a sawtooth pattern with the display blanked during flyback (bottom-to-top). FIG. 1 shows the sinusoidal pattern as the beam sweeps vertically top-to-bottom, but does not show the flyback from bottom-to-top. In other embodiments, the vertical sweep is controlled with a triangular wave such that there is no flyback. In still further embodiments, the vertical sweep is sinusoidal. The various embodiments of the invention are not limited by the waveforms used to control the vertical and horizontal sweep or the resulting raster pattern.

Scanning laser projector 100 provides video projection using a scanning modulated laser beam as described above. Scanning laser projector 100 also provides a proximity detection function to detect an obstruction in the projector's field of view 128. The proximity detection may be part of a safety circuit that disables one or more light sources when an obstruction is detected. The proximity detection may also be part of a safety circuit that reduces light source output when an obstruction is detected. For example, light source output may be reduced below Class 2 power levels when an obstruction is detected. Disabling, turning off, or reducing output of light sources may protect the obstruction from damage. For example, if the obstruction is a human eye, then disabling, turning off, or reducing the output of the light sources will prevent damage to the eye. Proximity detection is provided by a combination of elements within scanning laser projector 100. For example, IR laser light source 164, TOF photodetector (PD) 152, and TOF computation and control component 190 can be used together to detect an obstruction in the field of view of scanning laser projector, and also to determine its proximity to the projector.

In some embodiments, light source 164 sources nonvisible light such as infrared light. In these embodiments, TOF PD 152 is able to detect the same wavelength of nonvisible light. For example, in some embodiments, light source 164 may be an infrared laser diode that produces light with a wavelength of substantially 808 nanometers (nm), and TOF PD 152 is a photodiode that detects light of the same wavelength.

Figure 2:
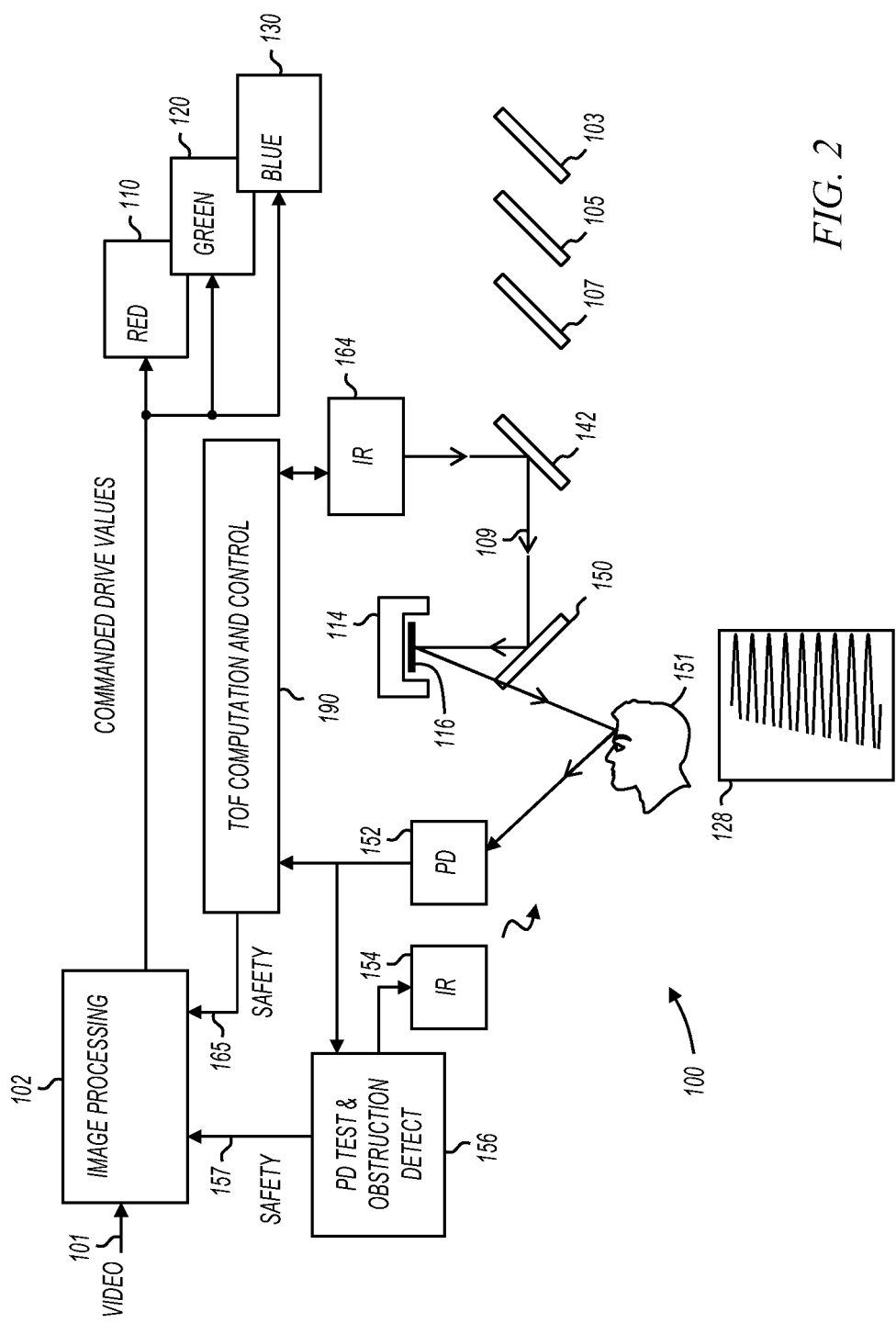
FIG. 2 shows the scanning laser projection system of FIG. 1 with an obstruction in the field of view in accordance with various embodiments of the present invention.

In operation, TOF computation and control component 190 commands IR laser light source 164 to emit IR laser light when proximity detection is to take place. In some embodiments, this occurs during raster scan 126 (an example of non-flyback time), and in other embodiments, this occurs during the flyback time. TOF PD 152 detects reflected IR light, and TOF computation and control component determines the round trip time of flight of the reflected IR light. If the time of flight is below a threshold, then an object has been detected and scanning projector 100 can take appropriate action, such as disabling, shutting off, or reducing the output of the red, green, and blue laser light sources. For example, in some embodiments, TOF computation and control component 190 provides a first safety signal to image processing component 102 on node 165. In response to receiving an asserted safety signal on node 165, image processing component 102 commands the visible light sources to stop emitting light or to reduce the output of emitted light. An example of this proximity operation is shown in FIG. 2.

TOF computation and control component 190 is a first safety circuit that performs proximity detection using a time of flight calculation. When an object is detected too close to the projector using time of flight calculations, the light sources are disabled or the output of the light sources is reduced.

Scanning laser projector 100 also includes additional infrared light source 154. In some embodiments, IR light source 154 is a light emitting diode (LED) that does not produce coherent light. In these embodiments, a portion of noncoherent IR light produced by the IR LED is detected by the photodetector. This may be used to test the functionality of the TOF photodetector. In some embodiments, IR 154 is driven during a flyback time, and in other embodiments, IR 154 is driven during a non-flyback time (e.g., during the raster scan).

In some embodiments, IR light source 154 is used to test the functionality of TOF photodetector 152, and is also used to detect local obstructions that block TOF photodetector 152. PD test and obstruction detection component 156 is coupled to IR light source 154 and TOF photodetector 152. In some embodiments, component 156 functions to drive IR light source 154 and receive a signal from TOF photodetector 152. The signal received from the photodetector may be interpreted as a successful test of the photodetector's functionality or may be interpreted as an indication of a local obstruction. In some embodiments, component 156 differentiates between these two cases based on received signal amplitude. Examples are further described below with reference to FIGS. 3, 6, and 7.

PD test and obstruction detection component 156 is a second safety circuit that performs proximity detection using received signal strength. When an object is detected too close to the projector based on received signal strength, the light sources are disabled or the output of the light sources is reduced. For example, component 156 may provide a safety signal to image processing component 102 on node 157. In response to the safety signal on node 157, image processing component 102 may command the visible light sources to turn off, or to reduce output power below Class 2 levels.

The various components shown in FIG. 1 may include any circuitry capable of performing the functions described. For example, in some embodiments, image processing component 102 includes digital circuits capable of performing interpolation such as multipliers, shifters, and adders. Also for example, in some embodiments, image processing component 102 may include hardware circuits and may also include a processor that executes instructions. In still further examples, TOF computation and control component 190 and PD test and obstruction detection component 156 may include digital and analog circuits capable of performing signal detection and measurement. Also for example, in some embodiments, these components may include hardware circuits and may also include a processor that executes instructions.

FIG. 2 shows the scanning laser projection system of FIG. 1 with an obstruction in the field of view in accordance with various embodiments of the present invention. The obstruction in the projector field of view is shown as a human head. IR laser light from IR light source 164 is reflected off the obstruction 151, and a reflection is received at TOF photodetector 152. TOF computation and control component 190 determines that the obstruction is too close, and commands image processing component 102 to not drive the visible light sources. Accordingly, in the example of FIG. 2, the visible light sources are turned off and the IR light source remains turned on. When the obstruction is no longer detected in the projector field of view, the visible light sources may be turned back on.

In some embodiments, when TOF computation and control component 190 determines that the obstruction is too close, image processing component 102 is commanded to reduce the output power of the visible light sources. For example, in some embodiments, the output power of the visible light sources is reduced to below Class 2 levels.

Figure 3:
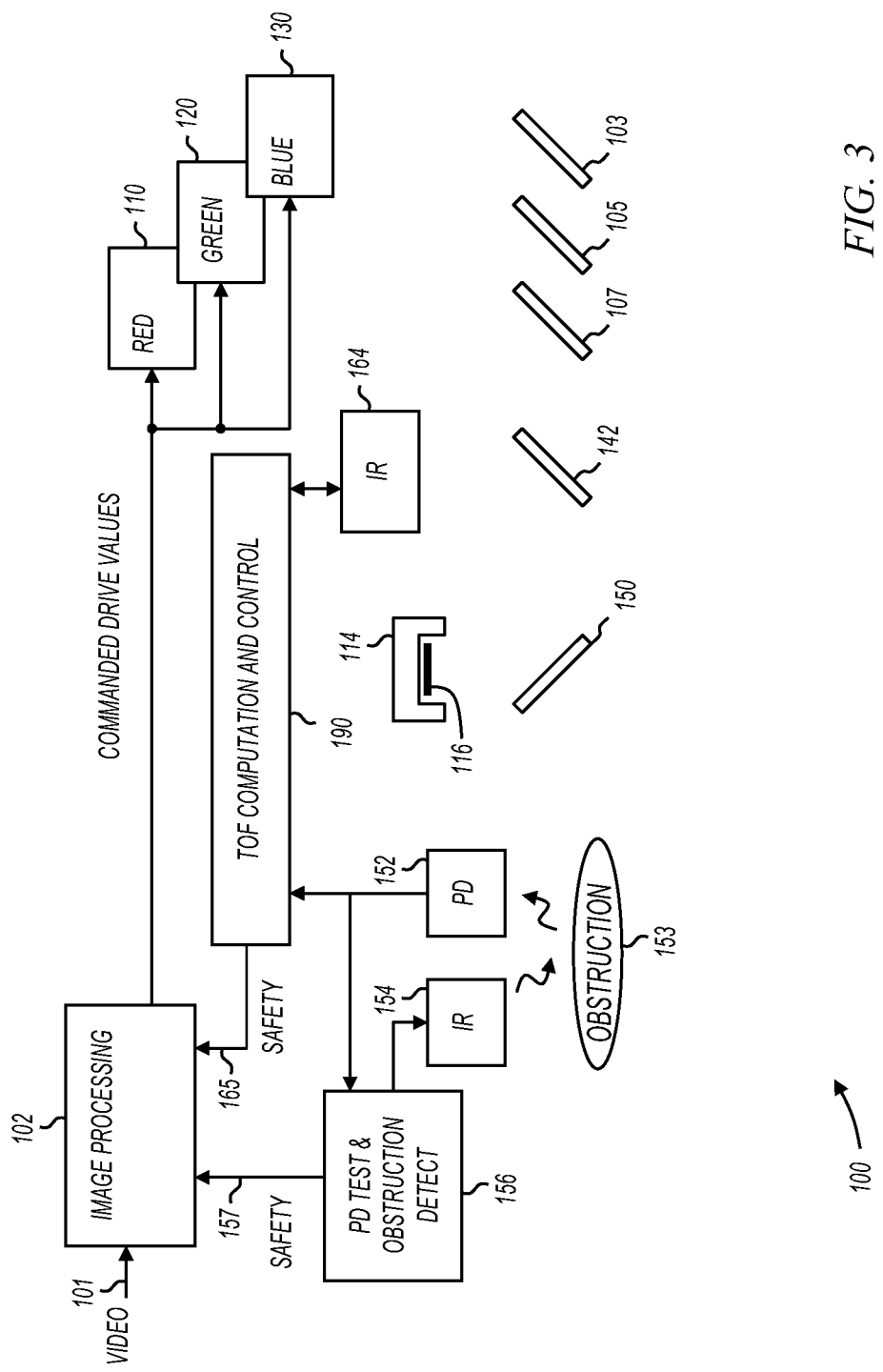
FIG. 3 shows the scanning laser projection system of FIG. 1 with a local obstruction blocking the photodetector in accordance with various embodiments of the present invention.

FIG. 3 shows the scanning laser projection system of FIG. 1 with a local obstruction blocking the TOF photodetector in accordance with various embodiments of the present invention. Obstruction 153 may be any local obstruction that provides a reflected light path. For example, obstruction 153 reflects IR light produced by IR light source 154 to TOF photodetector 152. PD test and obstruction detection component 156 determines that a local obstruction is present based on received signal amplitude, and commands image processing component 102 to shut off the visible light sources. In some embodiments, IR light source 164 is also shut off. When the obstruction 153 is no longer detected, the visible and invisible light sources may be turned back on.

In some embodiments, when PD test and obstruction detection component 156 determines that a local obstruction is present, image processing component 102 is commanded to reduce the output power of the visible light sources. For example, in some embodiments, the output power of the visible light sources is reduced to below Class 2 levels.

Figure 4:
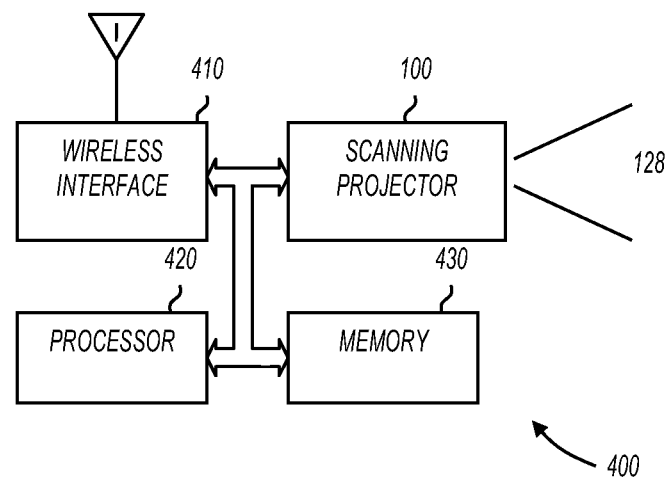
FIG. 4 shows a block diagram of a mobile device in accordance with various embodiments of the present invention.

FIG. 4 shows a block diagram of a mobile device in accordance with various embodiments of the present invention. As shown in FIG. 4, mobile device 400 includes wireless interface 410, processor 420, memory 430, and scanning projector 100. Scanning projector 100 paints a raster image in the projector's field of view 128. Scanning projector 100 includes an infrared laser light source, an additional infrared light source, a TOF photodetector, and one or more safety circuits as described above with reference to previous figures. Scanning projector 100 may be any projection apparatus described herein.

Scanning projector 100 may receive image data from any image source. For example, in some embodiments, scanning projector 100 includes memory that holds still images. In other embodiments, scanning projector 100 includes memory that includes video images. In still further embodiments, scanning projector 100 displays imagery received from external sources such as connectors, wireless interface 410, a wired interface, or the like.

Wireless interface 410 may include any wireless transmission and/or reception capabilities. For example, in some embodiments, wireless interface 410 includes a network interface card (NIC) capable of communicating over a wireless network. Also for example, in some embodiments, wireless interface 410 may include cellular telephone capabilities. In still further embodiments, wireless interface 410 may include a global positioning system (GPS) receiver. One skilled in the art will understand that wireless interface 410 may include any type of wireless communications capability without departing from the scope of the present invention.

Processor 420 may be any type of processor capable of communicating with the various components in mobile device 400. For example, processor 420 may be an embedded processor available from application specific integrated circuit (ASIC) vendors, or may be a commercially available microprocessor. In some embodiments, processor 420 provides image or video data to scanning projector 100. The image or video data may be retrieved from wireless interface 410 or may be derived from data retrieved from wireless interface 410. For example, through processor 420, scanning projector 100 may display images or video received directly from wireless interface 410. Also for example, processor 420 may provide overlays to add to images and/or video received from wireless interface 410, or may alter stored imagery based on data received from wireless interface 410 (e.g., modifying a map display in GPS embodiments in which wireless interface 410 provides location coordinates).

Figure 5:
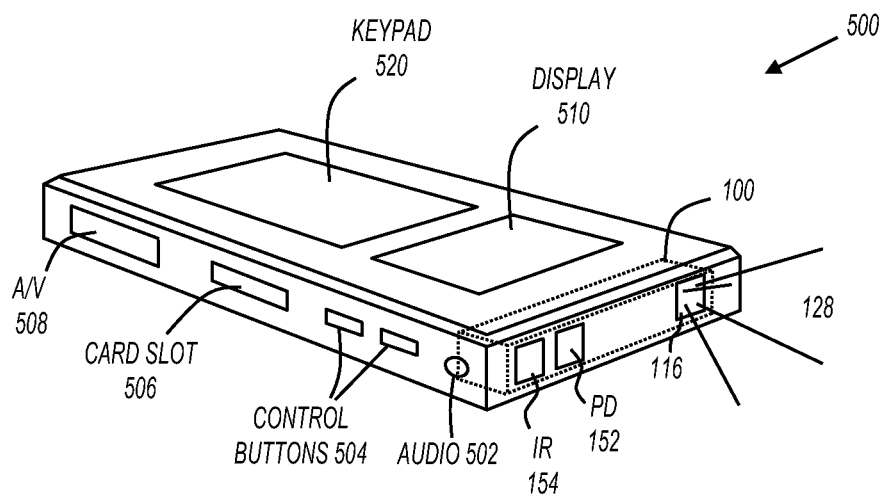
FIG. 5 shows a mobile device in accordance with various embodiments of the present invention.

FIG. 5 shows a mobile device in accordance with various embodiments of the present invention. Mobile device 500 may be a hand held projection device with or without communications ability. For example, in some embodiments, mobile device 500 may be a handheld projector with little or no other capabilities. Also for example, in some embodiments, mobile device 500 may be a device usable for communications, including for example, a cellular phone, a smart phone, a personal digital assistant (PDA), a global positioning system (GPS) receiver, or the like. Further, mobile device 500 may be connected to a larger network via a wireless (e.g., WiMax) or cellular connection, or this device can accept data messages or video content via an unregulated spectrum (e.g., WiFi) connection.

Mobile device 500 includes scanning projector 100 to create an image with light at field of view 128. Mobile device 500 also includes many other types of circuitry; however, they are intentionally omitted from FIG. 5 for clarity.

Mobile device 500 includes display 510, keypad 520, audio port 502, control buttons 504, card slot 506, and audio/video (A/V) port 508. None of these elements are essential. For example, mobile device 500 may only include scanning projector 100 without any of display 510, keypad 520, audio port 502, control buttons 504, card slot 506, or A/V port 508. Some embodiments include a subset of these elements. For example, an accessory projector product may include scanning projector 100, control buttons 504 and A/V port 508.

Display 510 may be any type of display. For example, in some embodiments, display 510 includes a liquid crystal display (LCD) screen. Display 510 may always display the same content projected at field of view 128 or different content. For example, an accessory projector product may always display the same content, whereas a mobile phone embodiment may project one type of content at field of view 128 while displaying different content on display 510. Keypad 520 may be a phone keypad or any other type of keypad.

A/V port 508 accepts and/or transmits video and/or audio signals. For example, A/V port 508 may be a digital port that accepts a cable suitable to carry digital audio and video data such as a high definition multimedia interface (HDMI) port. Further, A/V port 508 may include RCA jacks to accept composite inputs. Still further, A/V port 508 may include a VGA connector to accept analog video signals. In some embodiments, mobile device 500 may be tethered to an external signal source through A/V port 508, and mobile device 500 may project content accepted through A/V port 508. In other embodiments, mobile device 500 may be an originator of content, and A/V port 508 is used to transmit content to a different device.

Audio port 502 provides audio signals. For example, in some embodiments, mobile device 500 is a media player that can store and play audio and video. In these embodiments, the video may be projected at field of view 128 and the audio may be output at audio port 502. In other embodiments, mobile device 500 may be an accessory projector that receives audio and video at A/V port 508. In these embodiments, mobile device 500 may project the video content at field of view 128, and output the audio content at audio port 502.

Mobile device 500 also includes card slot 506. In some embodiments, a memory card inserted in card slot 506 may provide a source for audio to be output at audio port 502 and/or video data to be projected at field of view 128. Card slot 506 may receive any type of solid state memory device, including for example, Multimedia Memory Cards (MMCs), secure digital (SD) memory cards, and microSD cards. The foregoing list is meant to be exemplary, and not exhaustive.

Figure 6:
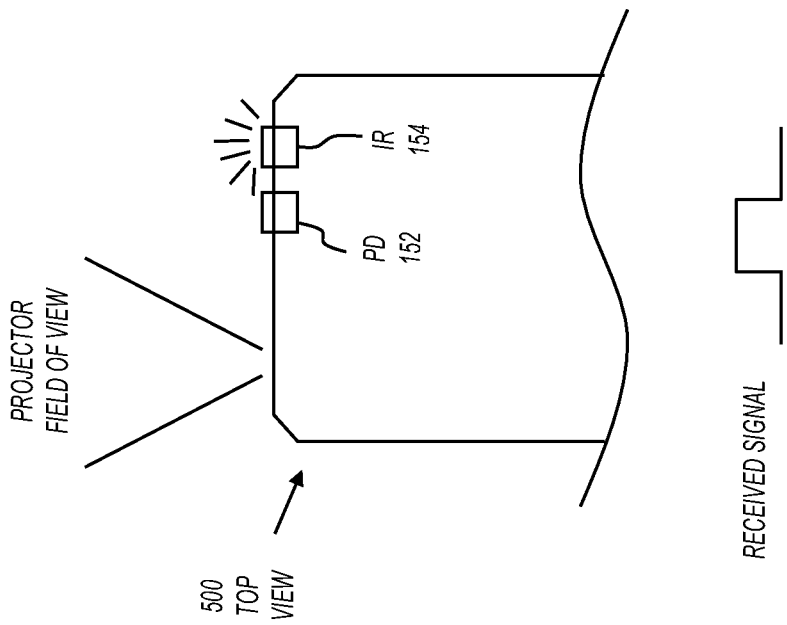
FIG. 6 shows a mobile device testing a photodetector in accordance with various embodiments of the present invention.

FIG. 6 shows a mobile device testing a photodetector in accordance with various embodiments of the present invention. A top view of mobile device 500 (FIG. 5) is shown in FIG. 6. PD 152 and IR 154 are shown. In some embodiments, IR 154 and PD 152 are placed such that edge coupling between the two devices is controlled, continuous, and calibrated. As shown in FIG. 6, when no local obstruction is present, a signal received at PD 152 will be of a known magnitude. This allows for testing of the photodetector to verify operation.

Figure 7:
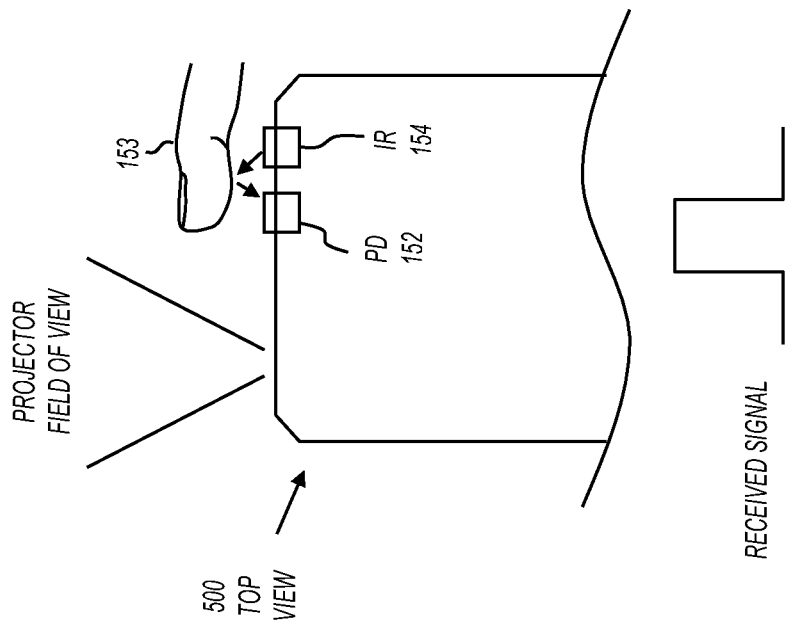
FIG. 7 shows a mobile device detecting a local obstruction in accordance with various embodiments of the present invention.

FIG. 7 shows a mobile device detecting a local obstruction in accordance with various embodiments of the present invention. FIG. 7 shows the mobile device of FIG. 6 and also shows a local obstruction 153 in the form of a human finger. This is a realistic scenario as a user may obstruct the photodetector while holding mobile device 500. If a user blocks the photodetector in this manner, the various embodiments of the present invention can detect the local obstruction and take appropriate action. As shown in FIG. 7, the magnitude of the received signal is greater when an obstruction is present. The second safety circuit (PD test and obstruction detection component 156; FIG. 1) can determine whether a local obstruction is present based on received signal amplitude.

In some embodiments, IR 154 is driven with different signal strengths when verifying operation of PD 152 and when detecting a local obstruction. For example, IR 154 may be driven with a lower amplitude signal when verifying operation than when detecting an obstruction. Any combination of signal strengths and thresholds may be used when driving IR 154 to verify the operation of PD 152 or to detect a local obstruction without departing from the scope of the present invention.

Although not specifically shown in FIGS. 6 and 7, fault coverage extends to both the transmit circuits and the receive circuits of the TOF proximity detection system. For example, the laser light source photodetectors (111, 121, 131, 156; FIG. 1) may be used to test that the transmit circuits (light producing circuits) are functioning, and the operations described with reference to FIGS. 6 and 7 may be employed to test that the receive circuits (PD 152 and related components) are functioning.

Figure 8:
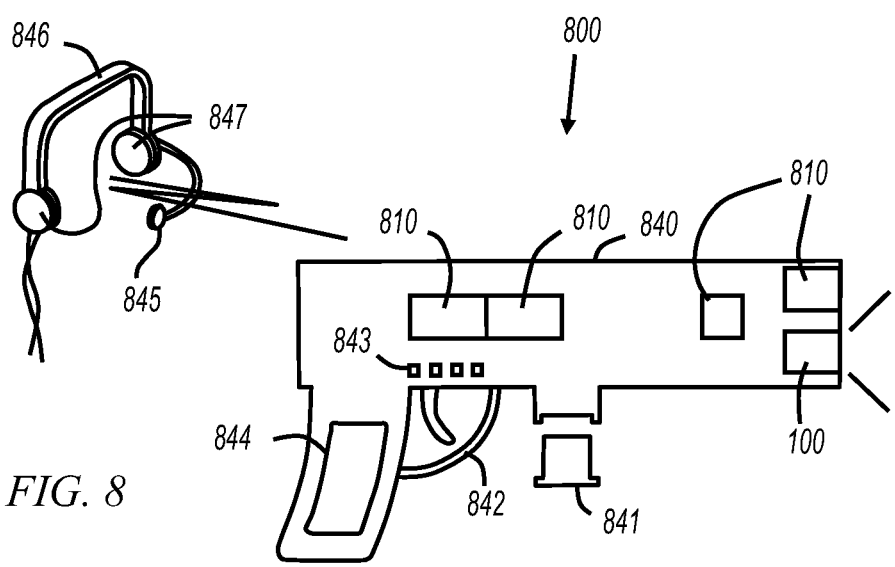
FIG. 8 shows a gaming apparatus in accordance with various embodiments of the present invention.

FIG. 8 shows a gaming apparatus in accordance with various embodiments of the present invention. Gaming apparatus 800 allows a user or users to observe and interact with a gaming environment. The game is navigated based on the motion, position or orientation of gaming apparatus 800, an apparatus that includes projection apparatus 100. Other control interfaces, such as manually-operated buttons, foot pedals, or verbal commands, may also contribute to navigation around, or interaction with the gaming environment. For example, in some embodiments, trigger 842 contributes to the illusion that the user or users are in a first person perspective video game environment, commonly known as a "first person shooter game." Because the projected display can be controlled by the gaming application in combination with the user's movement, gaming apparatus 800 creates a highly believable or "immersive" environment for these users.

Many other first person perspective simulations can also be created by gaming apparatus 800, for such activities as 3D seismic geo-prospecting, spacewalk planning, jungle canopy exploration, automobile safety instruction, medical education, etc. Tactile interface 844 may provide a variety of output signals, such as recoil, vibration, shake, rumble, etc. Tactile interface 844 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 800 may also include audio output devices, such as integrated audio speakers, remote speakers, or headphones. These sorts of audio output devices may be connected to gaming apparatus 800 with wires or through a wireless technology. For example, wireless headphones 846 provide the user with sound effects via a Bluetooth connection, although any sort of similar wireless technology could be substituted freely. In some embodiments, wireless headphones 846 may include microphone 845 or binaural microphone 847, to allow multiple users, instructors, or observers to communicate. Binaural microphone 847 typically includes microphones on each ear piece, to capture sounds modified by the user's head shadow. This feature may be used for binaural hearing and sound localization by other simulation participants.

Gaming apparatus 800 may include any number of sensors 810 that measure distance, ambient brightness, motion, position, orientation, and the like. For example, gaming apparatus 800 may detect absolute heading with a digital compass, and detect relative motion with an x-y-z gyroscope or accelerometer. In some embodiments, gaming apparatus 800 also includes a second accelerometer or gyroscope to detect the relative orientation of the device, or its rapid acceleration or deceleration. In other embodiments, gaming apparatus 800 may include a Global Positioning Satellite (GPS) sensor, to detect absolute position as the user travels in terrestrial space.

Gaming apparatus 800 may include battery 841 and/or diagnostic lights 843. For example, battery 841 may be a rechargeable battery, and diagnostic lights 843 could indicate the current charge of the battery. In another example, battery 841 may be a removable battery clip, and gaming apparatus 800 may have an additional battery, electrical capacitor or super-capacitor to allow for continued operation of the apparatus while the discharged battery is replaced with a charged battery. In other embodiments, diagnostic lights 843 can inform the user or a service technician about the status of the electronic components included within or connected to this device. For example, diagnostic lights 843 may indicate the strength of a received wireless signal, or the presence or absence of a memory card. Diagnostic lights 843 could also be replaced by any small screen, such as an organic light emitting diode or liquid crystal display screen. Such lights or screens could be on the exterior surface of gaming apparatus 800, or below the surface, if the shell for this apparatus is translucent or transparent.

Other components of gaming apparatus 800 may be removable, detachable or separable from this device. For example, the projection apparatus 100 may be detachable or separable from gaming housing 840. In some embodiments, the subcomponents of the projection apparatus 100 may be detachable or separable from gaming housing 840, and still function.

Figure 9:
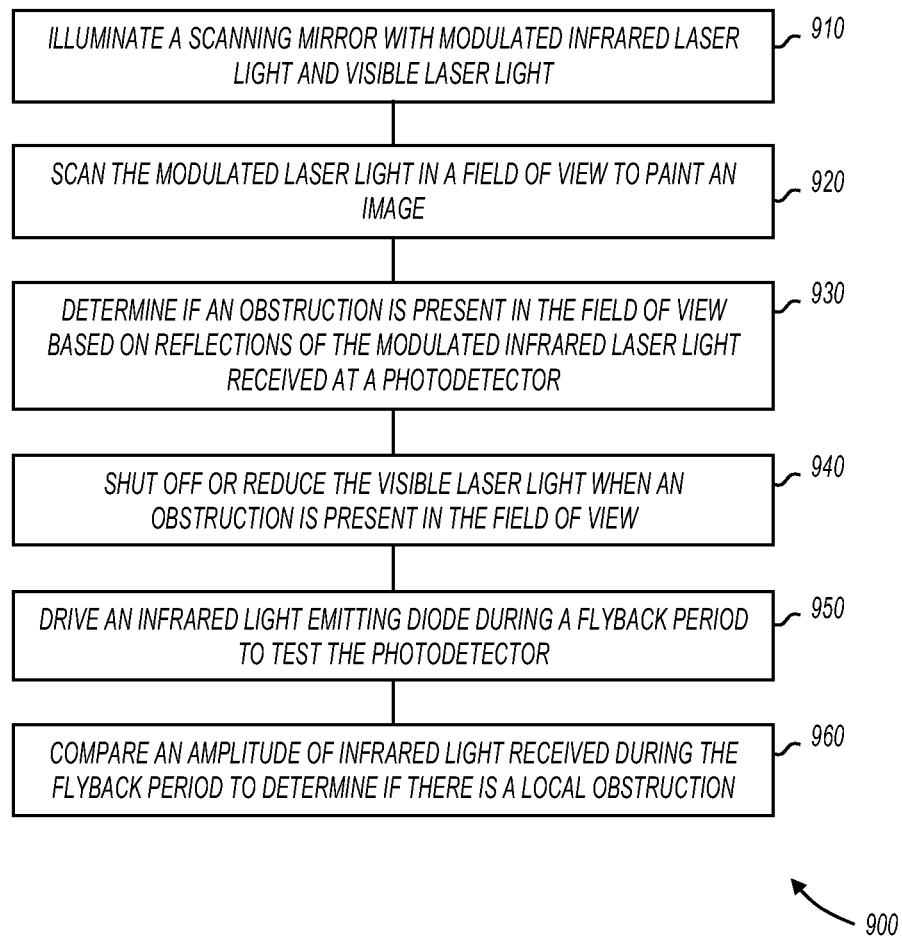
FIG. 9 shows a flow diagram of methods in accordance with various embodiments of the present invention.

FIG. 9 shows a flow diagram of methods in accordance with various embodiments of the present invention. In some embodiments, method 900, or portions thereof, is performed by one or more safety circuits, embodiments of which are shown in previous figures. Further, in some embodiments, method 900, or portions thereof, is performed by a scanning laser projector, embodiments of which are shown in previous figures. In other embodiments, method 900 is performed by a series of circuits or an electronic system. Method 900 is not limited by the particular type of apparatus performing the method. The various actions in method 900 may be performed in the order presented, or may be performed in a different order. Further, in some embodiments, some actions listed in FIG. 9 are omitted from method 900.

Method 900 is shown beginning with block 910 in which a scanning mirror is illuminated with infrared laser light and visible laser light. In some embodiments, this corresponds to scanning mirror 116 (FIG. 1) being illuminated with laser light from the various light sources shown in FIG. 1. At 920, the modulated laser light is scanned in a field of view to paint an image. This is shown at, and described with reference to, projector field of view 128 (FIG. 1). At 930, method 900 determines if an obstruction is present in the field of view based on reflections of the modulated infrared laser light received at a photodetector. In some embodiments, this corresponds to TOF computation and control component 190 (FIG. 1) measuring the round trip time of flight for a reflected infrared light pulse.

At 940, visible laser light sources are shut off or the visible laser light output from the laser light sources is reduced when an obstruction is detected in the field of view. In some embodiments, the light is reduces or the laser light sources are shut off only when an obstruction is detected within a certain proximity of the projector. At 950, an infrared light emitting diode is driven during a flyback period to test the photodetector and/or to detect a local obstruction. In some embodiments, the IR LED is driven during a flyback period to test the photodetector, and is driven during a non-flyback period to detect local obstructions.

At 960, a signal is received at the photodetector, and the amplitude of the received signal is compared to a threshold to determine if a local obstruction is present. Examples of local obstructions and relative received signal amplitudes are described above with reference to FIGS. 6 and 7.

Although various invention embodiments have been thus far described as using infrared light when performing TOF proximity detection and local obstruction detection, the present invention is not so limited. For example, in some embodiments, the proximity detection and local obstruction detection utilize visible light. In these embodiments, one or more of the red, green, and/or blue light sources may be utilized, and PD 152 detects the corresponding color of light. Further, in some embodiments, either of the proximity detection and local obstruction detection may occur at any time. For example, either or both may occur during the raster scan or during the flyback time without departing from the scope of the present invention.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A scanning laser projector comprising:
 a scanning mirror to reflect a modulated light beam in a raster pattern;
 an infrared laser light source to produce infrared light as part of the modulated light beam;
 a photodetector to detect reflections of the modulated light beam;
 a safety circuit configured to determine if the modulated light beam is reflecting off an obstruction;
 an infrared light emitting diode to produce infrared light to test the photodetector; and
 a second safety circuit coupled to the infrared light emitting diode and the photodetector, the second safety circuit configured to detect a local obstruction blocking the photodetector.

2. A scanning laser projector comprising:
 a scanning mirror to reflect a modulated light beam in a raster pattern;
 an infrared laser light source to produce infrared light as part of the modulated light beam;
 a photodetector to detect reflections of the modulated light beam;
 a safety circuit configured to determine if the modulated light beam is reflecting off an obstruction; and
 an infrared light emitting diode to produce infrared light to test the photodetector, wherein the infrared light emitting diode produces infrared light during a flyback period.

3. A scanning laser projector comprising:
 a scanning mirror to reflect a modulated light beam in a raster pattern;
 an infrared laser light source to produce infrared light as part of the modulated light beam;
 a photodetector to detect reflections of the modulated light beam;
 a safety circuit configured to determine if the modulated light beam is reflecting off an obstruction; and
 an infrared light emitting diode to produce infrared light to test the photodetector, wherein the infrared light emitting diode is driven during a flyback period to test the photodetector and is driven during a non-flyback period to detect local obstructions.

4. The scanning laser projector of claim 3 further comprising at least one visible laser light source to produce visible laser light as part of the modulated light beam, wherein the at least one visible laser light source and the infrared laser light source are shut off when a local obstruction is detected.

5. The scanning laser projector of claim 4 wherein the at least one visible laser light source comprises at least one each of a red laser light source, a green laser light source, and a blue laser light source.

6. A method comprising:
   illuminating a scanning mirror with modulated infrared laser light and visible laser light;
   scanning the modulated laser light in a field of view to paint an image;
   determining if an obstruction is present in the field of view based on reflections of the modulated infrared laser light received at a photodetector;
   reducing the visible laser light when an obstruction is present in the field of view; and
   driving an infrared light emitting diode to test the photodetector, wherein driving an infrared light emitting diode comprises driving the infrared light emitting diode during a flyback period, the method further comprising comparing an amplitude of infrared light received during the flyback period to determine if there is a local obstruction.

7. The method of claim 6 further comprising shutting off all laser light sources when there is a local obstruction.

8. The method of claim 6 further comprising shutting off all visible laser light sources when there is a local obstruction.

9. A method comprising:
   illuminating a scanning mirror with modulated infrared laser light and visible laser light;
   scanning the modulated laser light in a field of view to paint an image;
   determining if an obstruction is present in the field of view based on reflections of the modulated infrared laser light received at a photodetector, wherein determining if an obstruction is present in the field of view comprises measuring a time of flight of the reflections of the modulated infrared laser light received at the photodetector;
   reducing the visible laser light when an obstruction is present in the field of view; and
   driving an infrared light emitting diode to test the photodetector, wherein driving an infrared light emitting diode comprises driving the infrared light emitting diode during a flyback period, the method further comprising comparing an amplitude of infrared light received during the flyback period to determine if there is a local obstruction.

10. A mobile device comprising:
   a radio capable of receiving video information; and
   a scanning laser projector to display the video information, the scanning laser projector including:
      a scanning mirror to reflect a modulated light beam in a raster pattern;
      an infrared laser light source to produce infrared light as part of the modulated light beam;
      a photodetector to detect reflections of the modulated light beam;
      a first safety circuit configured to determine if the modulated light beam is reflecting off an obstruction;
      an infrared light emitting diode to produce infrared light to test the photodetector; and
      a second safety circuit coupled to the photodetector and the infrared light emitting diode to determine if a local obstruction is blocking the photodetector.

11. The mobile device of claim 10 wherein the mobile device comprises a mobile phone.

12. The mobile device of claim 10 wherein the mobile device comprises a gaming device.

13. The mobile device of claim 10 further comprising at least one visible laser light source to produce visible laser light as part of the modulated light beam, wherein the at least one visible laser light source is shut off when the modulated light beam is reflected off an obstruction.

14. The mobile device of claim 13 wherein the at least one visible laser light source comprises at least one each of a red laser light source, a green laser light source, and a blue laser light source.

15. The mobile device of claim 10 wherein the infrared light emitting diode is driven during a flyback period to test the photodetector and is driven during a non-flyback period to detect local obstructions.

* * * * *